United States Patent
Zhong et al.

(10) Patent No.: US 11,740,193 B2
(45) Date of Patent: Aug. 29, 2023

(54) DSC THERMAL ANALYSIS METHOD FOR ACTION OF APPLIED ELECTRIC FIELD

(71) Applicant: XI'AN JIAOTONG UNIVERSITY, Shaanxi (CN)

(72) Inventors: Lisheng Zhong, Shaanxi (CN); Xiaoyuan Song, Shaanxi (CN); Jinghui Gao, Shaanxi (CN); Qinxue Yu, Shaanxi (CN)

(73) Assignee: XI'AN JIAOTONG UNIVERSITY, Xi'an (CN)

( * ) Notice: Subject to any disclaimer, the term of this patent is extended or adjusted under 35 U.S.C. 154(b) by 339 days.

(21) Appl. No.: 16/989,637

(22) Filed: Aug. 10, 2020

(65) Prior Publication Data
US 2021/0041381 A1 Feb. 11, 2021

(30) Foreign Application Priority Data
Aug. 8, 2019 (CN) .......................... 201910732218.9

(51) Int. Cl.
*G01N 25/04* (2006.01)
*G01R 29/12* (2006.01)

(52) U.S. Cl.
CPC ............. *G01N 25/04* (2013.01); *G01R 29/12* (2013.01)

(58) Field of Classification Search
CPC ................................. G01N 25/04; G01R 29/12
See application file for complete search history.

(56) References Cited

U.S. PATENT DOCUMENTS

| 5,211,477 A * | 5/1993 | Li ....................... G01R 27/2635 374/33 |
| 6,170,984 B1 * | 1/2001 | Schawe ............. G01N 25/4833 374/10 |
| 6,428,203 B1 * | 8/2002 | Danley ............. G01N 25/4866 374/33 |

(Continued)

OTHER PUBLICATIONS

Ma et al., Manipulating ice crystallization of 0.9 wt. % NaCl aqueous solution by alternating current electric field, May 2013, pp. 1-5 (Year: 2013).*

(Continued)

*Primary Examiner* — Michael J Dalbo
(74) *Attorney, Agent, or Firm* — Dragon Sun Law Firm, PC; Nathaniel Perkins (57) ABSTRACT

A Differential Scanning calorimetry (DSC) thermal analysis method for the action of an applied electric field includes: step 1, in an experiment module of a differential scanning calorimeter, placing a microelectrode crucible and a reference crucible on corresponding sensors, connecting electrode wires of the microelectrode crucible with a signal generator, setting signal parameters to be output, placing a tested sample in a gap between electrodes, closing a microelectrode crucible lid, and closing the experiment module; step 2, at a temperature-varying stage, measuring a DSC curve of the tested sample under the action of an electric field, and at a reheating stage, measuring a DSC curve of the tested sample with no electric field; and step 3, analyzing the DSC curves in combination with the related theories of dielectrics and thermodynamics, and calculating an electric field intensity of the tested sample and a phase transformation rate of the tested sample.

7 Claims, 3 Drawing Sheets

Step 1: place test devices and a tested sample

Step 2: measure temperature-varying DSC curves of the sample under the action of an applied electric field and with no applied electric field Step 3: analyze the DSC curves, and calculate the electric field intensity and a phase transformation rate (56) References Cited

U.S. PATENT DOCUMENTS 6,431,747 B1 * 8/2002 Danley .............. G01N 25/4833
374/33

OTHER PUBLICATIONS

Gill et al., Differential Scanning Calorimetry Techniques: Applications in Biology and Nanoscience, Dec. 2010, pp. 168, 169, 174 (Year: 2010).*
Bruno, ResearchGate, Oct. 2015, pp. 1, 2 (Year: 2015).*
Murdock, Worked Examples from Introductory Physics (Algebra-Based), Jan. 2008, pp. 28, 36 (Year: 2008).*
Dalvi-Isfahan, Effect of freezing under electrostatic field on selected properties of an agar gel, Innovative Food Science and Emerging Technologies 42 (2017) 151-156 (Year: 2017).*

* cited by examiner

DSC THERMAL ANALYSIS METHOD FOR ACTION OF APPLIED ELECTRIC FIELD

CROSS-REFERENCE TO RELATED PATENT APPLICATION

This application claims priority to and the benefit of CN 2019107322189, filed Aug. 8, 2019, entitled "DSC Thermal Analysis Method for Action of Applied Electric Field," by Lisheng Zhong et al. The entire disclosure of the above-identified application is incorporated herein by reference.

Some references, which may include patents, patent applications, and various publications, are cited and discussed in the description of the present invention. The citation and/or discussion of such references is provided merely to clarify the description of the present invention and is not an admission that any such reference is "prior art" to the invention described herein. All references cited and discussed in this specification are incorporated herein by reference in their entireties and to the same extent as if each reference was individually incorporated by reference.

TECHNICAL FIELD

The present invention relates to the field of thermal analysis methods, and more particularly relates to a Differential Scanning calorimetry (DSC) thermal analysis method for the action of an applied electric field.

BACKGROUND

Biodielectric is an important research direction in the interdisciplinary field of electromagnetics and biological materials. The study on the biodielectric can help deepen people's understanding of the interaction between the electromagnetics and the biological materials, and promote its wider application. At present, an important problem in a biological material cryopreservation technology is how to avoid the low-temperature damage to the biological materials during cooling. The main reason for the low-temperature damage is that water contained in biological tissues is crystallized in a freezing process to produce ice crystals, resulting in chemical damage caused by cell dehydration or physical damage caused by cell membrane pierced by the ice crystals. Therefore, the avoidance of the low-temperature damage to the biological materials is mainly to inhibit the crystallization of water in the biological tissues during the cooling.

At present, common biological material cryopreservation methods mainly include a rapid cooling method, a cryoprotectant adding method, or a combination of the two methods. However, the rapid cooling method is only suitable for the preservation of relatively small biological materials. When a biological material that needs to be preserved is relatively large in size, the inside of the material cannot achieve the same cooling rate as the surface of the material due to the influence of heat conduction; and addition of a cryoprotectant is not only complicated in operation, but also has a problem of difficult removal of the cryoprotectant after the material is reheated. In addition, some cryoprotectants have toxic and harmful effects on the biological materials, so that the application scenarios are limited.

Since water molecules are polar molecules, they will generate dipole polarization under the action of an applied electromagnetic field. This polarization effect will interfere with the balance of water molecule clusters, and then affect the liquid-solid phase change property of the water molecules. Studies have shown that the application of an appropriate electromagnetic field can inhibit the crystallization of the water molecules in the biological tissues to a certain extent, thereby reducing the degree of damage to the biological materials caused by low-temperature freezing.

At the present stage, the relevant studies on the low-temperature freezing of the biological materials are mainly realized through microscopic observation. Experimental results of the microscopic observation are relatively intuitive and clear, but there are still three problems as follows: first, an observed sample needs to be of a thin sheet shape, which does not match an actual state of a biological material in practical application; second, most of salt ions and ice crystals are colorless, which makes more detailed microscopic observation more difficult; and third, the analysis of the results of the microscopic observation often requires subjective identification, and there is no unified method, which is not convenient for more subtle quantitative calculations and depth mechanism analysis.

The traditional methods for measuring and verifying an action of an applied electric field to the biological material make further analysis only by comparing different ice crystal statuses of water in frozen biological tissues or different characters of reheated biological materials, which is not convenient for real-time recording. Differential Scanning calorimetry (DSC) can measure a relationship between heat flows and temperatures of input and output samples and a reference when a tested sample is heated, cooled or at a constant temperature. A measurement signal is a change in energy absorbed or released by the tested sample, and is indicated by mW. In addition, the DSC can also be used to detect endothermic and exothermic effects, measure peak areas (transformation enthalpy and reaction enthalpy), measure temperatures of characterizing peaks or other effects, measure specific heat capacity, etc.

A differential scanning calorimeter is an instrument designed based on the principle of the DSC to measure the relationship of a temperature and a heat flow related to the internal thermal transformation of the material. During measurement, the differential scanning calorimeter generates a DSC curve, and heat flow changes of the biological material under low-temperature freezing and reheating conditions can be accurately recorded via the DSC curve, and further, the influence of different applied electric fields on a phase transformation rate of the material under a certain temperature condition is quantitatively calculated. In a low-temperature freezing process, an thermal effect caused by the conductivity of an electrolyte solution in the biological tissue moves up a DSC baseline, and the instantaneous liquid-solid phase change of the sample releases a large amount of latent heat, causing an increase of the temperature of a sample liquid, and making an exothermic ring of the latent heat of phase change that cannot be subjected to integral calculation appear in the DSC measurement curve. Therefore, in a cooling process, data cannot be used objectively as reference data. If liquid-solid phase change crystallization methods are different when the sample is frozen, the latent heat of phase change and phase change points corresponding to a solid-liquid phase change process are also be different under a reheating condition.

Based on the above factors, the present invention uses reheated DSC data with no applied electric field to evaluate an effect of the applied electric field. By embedding electrodes in a crucible, the differential scanning calorimeter is used to simultaneously monitor heat flow changes during freezing and reheating of the biological material under the action of an electric field. The phase transformation rate of the applied electric field to the material is calculated under a certain temperature condition in combination with related theories and models of dielectrics and thermodynamics, and a difference in the phase transformation rates of different applied electric field parameters to the material is further studied by comparing different influences on the ice crystals in the biological material caused by different electric field parameters, thereby providing theoretical and experimental basis for the applied electric field to improve cryopreservation efficiency and laying a foundation for cryopreservation of large-sized biological tissues.

The above information disclosed in the background is only for enhancing the understanding of the background of the present invention, and thus may contain information that does not form the prior art that is well known by those of ordinary skill in the art in this country.

Therefore, a heretofore unaddressed need exists in the art to address the aforementioned deficiencies and inadequacies.

SUMMARY

In view of the above problems, an objective of the present invention is to provide a Differential Scanning calorimetry (DSC) thermal analysis method for the action of an applied electric field to overcome the shortcomings in the prior art. According to the method, heat flow changes of a biological material during freezing and reheating under the action of the applied electric field can be monitored in real time through a differential scanning calorimeter in combination with related theories of dielectrics and thermodynamics, a DSC curve is generated, an influence difference in a phase transformation rate of different electric field parameters to the material can be calculated, and an action mechanism of the electric field on ice crystal formation and growth of the biological material in a freezing process is disclosed, thus exploring optimal applied electric field parameters to effectively inhibit damage caused by ice crystals to biological tissues and improve the cryopreservation efficiency.

The objective of the present invention is achieved through the following technical solutions.

A Differential Scanning calorimetry (DSC) thermal analysis method for the action of an applied electric field is provided. The method includes the following steps:

step 1, placing a microelectrode crucible, a reference crucible and a tested sample into an experiment module of a differential scanning calorimeter, wherein the microelectrode crucible is used to apply an electric field to the tested sample, and the reference crucible is used as a reference when no electric field is applied to the tested sample;

step 2, presetting a measurement temperature in a computer to control a temperature variation in the differential scanning calorimeter, and measuring DSC curves of the tested sample during freezing and reheating under the action of the applied electric field in the microelectrode crucible and with no applied electric field in the reference crucible, wherein the computer is connected with the differential scanning calorimeter and used to transmit a signal and record an experiment result; and step 3, analyzing the DSC curves in combination with the related theories of dielectrics and thermodynamics and an analysis method to obtain an electric field intensity of the tested sample and a phase transformation rate of the tested sample from a temperature-varying process to a reheating process, so as to analyze the influence of different electric field parameters on ice crystal formation in the tested sample.

The present invention further provides application of the DSC thermal analysis method for the action of the applied electric field in the field of cryopreservation of a biological material.

Compared with the prior art, the present invention has the following beneficial effects:

(1) by means of embedding electrodes into the crucible, through the differential scanning calorimeter, heat flow changes of the biological material during freezing and reheating under the action of the electric field are simultaneously monitored, the DSC curves are generated, an influence difference of the applied electric field on the phase transformation rate of the material under different temperature conditions is calculated in combination with the related theories and models of dielectrics and thermodynamics, and different impacts of different electric field parameters on the ice crystal formation in the biological material are compared, so as to provide theoretical and experimental basis for the applied electric field to improve the cryopreservation efficiency; and (2) according to the present invention, the operation is easy, the calculation result is accurate, repeatability is achieved, and a new study and analysis method is provided for a mechanism of formation of ice crystals in a material cryopreservation process.

The above description is only a summary of the technical solutions of the present invention. Specific implementation modes of the present invention are described below in order to make technical measures of the present invention more clearly to make those skilled in the art implement the technical measures in accordance with the content of the specification, and to make the above and other objectives, features and advantages of the present invention more understandable.

BRIEF DESCRIPTION OF THE DRAWINGS

The accompanying drawings illustrate one or more embodiments of the present invention and, together with the written description, serve to explain the principles of the invention. Wherever possible, the same reference numbers are used throughout the drawings to refer to the same or like elements of an embodiment.

By reading the detailed description of the preferred specific implementation modes below, various other advantages and benefits of the present invention will become clear to those of ordinary skill in the art. The accompanying drawings in the description are only used for illustrating the preferred implementation modes, and are not considered as a limitation to the present invention. Obviously, the accompanying drawings described below are only some embodiments of the present invention. Those of ordinary skill in the art can acquire other accompanying drawings based on these accompanying drawings without creative work. Furthermore, In the entire accompanying drawings, the same reference numerals are used to denote the same components.

In the accompanying drawings.

The present invention is further explained below in combination with the accompanying drawings and the embodiments.

DETAILED DESCRIPTION

The present invention will now be described more fully hereinafter with reference to the accompanying drawings, in which exemplary embodiments of the present invention are shown. The present invention may, however, be embodied in many different forms and should not be construed as limited to the embodiments set forth herein. Rather, these embodiments are provided so that this disclosure is thorough and complete, and will fully convey the scope of the invention to those skilled in the art. Like reference numerals refer to like elements throughout.

Specific embodiments of the present invention will be described in more detail below with reference to the accompanying drawings. Although the specific embodiments of the present invention are shown in the accompanying drawings, it should be understood that the present invention can be implemented in various forms and should not be limited by the embodiments set forth herein. On the contrary, these embodiments are provided for a more thorough understanding on the present invention and can fully deliver the scope of the present invention to those skilled in the art.

It should be noted that certain words are used in the description and claims to refer to specific components. Those skilled in the art should understand that they may use different terms to refer to the same component. In the specification and claims, differences in terms are not used as a way to distinguish components, but differences in functions of components are used as a criterion for distinguishing the components. A word "Comprise" or "include" as mentioned in the entire specification and claims is an open term, and should be interpreted as "including but not limited to". The following description of the specification is about preferred implementation modes for implementing the present invention. The description is based on a general principle of the specification and is not intended to limit the scope of the present invention. The protection scope of the present invention should be based on those defined by the appended claims.

In order to facilitate the understanding of the embodiments of the present invention, specific embodiments will be used as examples for further explanation and description in conjunction with the accompanying drawings, and the respective drawings do not constitute a limitation to the embodiments of the present invention.

Figure 1:
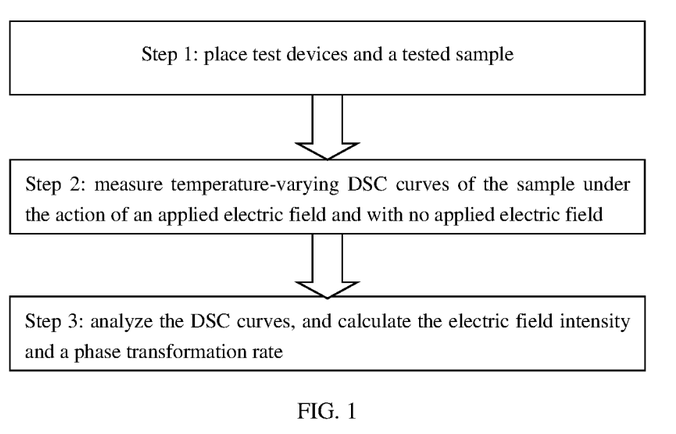
FIG. 1 is a flow diagram of a Differential Scanning calorimetry (DSC) thermal analysis method for the action of an applied electric field according to an embodiment of the present invention.

For better understanding, FIG. 1 is a flow diagram of a Differential Scanning calorimetry (DSC) thermal analysis method for the action of an applied electric field according to an embodiment of the present invention. A DSC thermal analysis method for the action of an applied electric field includes the following steps:

step 1, a microelectrode crucible, a reference crucible and a tested sample are placed in an experiment module of a differential scanning calorimeter, wherein the microelectrode crucible is used to apply an electric field to the tested sample, and the reference crucible is used as a reference when no electric field is applied to the tested sample;

step 2, a measurement temperature is preset in a computer to control a temperature variation in the differential scanning calorimeter, and DSC curves of the tested sample during freezing and reheating under the action of the applied electric field in the microelectrode crucible and with no applied electric field in the reference crucible are calculated, wherein the computer is connected with the differential scanning calorimeter and used to transmit a signal and record an experiment result; and step 3, the DSC curves are analyzed in combination with related theories of dielectrics and thermodynamics and an analysis method to obtain an electric field intensity of the tested sample and a phase transformation rate of the tested sample from a temperature-varying process to a reheating process, so as to analyze the influence of different electric field parameters on ice crystal formation in the tested sample.

On the one hand, by means of embedding electrodes in the crucible, through the differential scanning calorimeter, heat flow changes of a biological material during freezing and reheating under the action of an electric field are simultaneously monitored, the DSC curves are generated, an influence difference of the applied electric field on the phase transformation rate of the material under different temperature conditions is calculated in combination with the related theories and models of dielectrics and thermodynamics and a chemical phase analysis method, and different impacts of different electric field parameters on the formation of ice crystals in the biological material are compared, so as to provide theoretical and experimental basis for the applied electric field to improve the cryopreservation efficiency.

On the other hand, according to the present invention, the operation is easy, the calculation result is accurate, repeatability is achieved, and a new study and analysis method is provided for a mechanism of formation of ice crystals in a material cryopreservation process.

In one preferred embodiment, two electrodes are arranged in the microelectrode crucible in the step 1, and a gap for placing the tested sample is reserved between the electrodes. The tested sample is completely fitted to surfaces of the electrodes in the microelectrode crucible. The electrodes are connected with a signal generator through electrode wires. The signal generator presets signal parameters to be output, and is used to provide an electric signal to apply an electric field to the tested sample. A universal meter is used to check and confirm that the insulation property of the electrode wires is good, so as to exclude a short-circuit problem between the signal generator and the differential scanning calorimeter.

In one preferred embodiment, the microelectrode crucible and the reference crucible in the step 1 are placed on corresponding sensors in the differential scanning calorimeter, and the sensors are used to detect heat flow changes of the tested sample in the microelectrode crucible and the reference crucible, convert the heat flow changes into electric signals, and output the electric signals to the computer. The microelectrode crucible is completely fitted to the corresponding sensor.

In one preferred embodiment, the computer in the step 2 is connected with the differential scanning calorimeter and a self-pressurization liquid nitrogen tank. The self-pressurization liquid nitrogen tank is used to cool an interior of the experiment module of the differential scanning calorimeter.

In one preferred embodiment, after it is confirmed that the tested sample in the step 1 is completely fitted to the surfaces of the electrodes in the microelectrode crucible, a microelectrode crucible lid is closed, and the experiment module of the differential scanning calorimeter is closed.

In one preferred embodiment, the presetting of the measurement temperature in the computer in the step 2 includes a temperature-varying stage and a reheating stage. At the temperature-varying stage, the differential scanning calorimeter opens an output passageway of the signal generator to apply an electric field action to the tested sample. At the reheating stage, the differential scanning calorimeter closes the output passageway of the signal generator, the tested sample is naturally reheated with no applied electric field, thereby generating a DSC curve.

In one preferred embodiment, the phase transformation rate η of the tested sample in the step 3 in the temperature-varying process is:

$$\eta = \frac{\Delta Q_E}{\Delta Q_O} \times 100\%,$$

Wherein $\Delta Q_E$ refers to a quantity of heat absorbed or released by phase transformation of the tested sample during temperature varying under the action of the applied electric field and during reheating with no electric field, and $\Delta Q_O$ refers to a quantity of heat absorbed or released by phase transformation of the tested sample during temperature varying and reheating with no electric field.

$\Delta Q_E$ is obtained by a DSC curve corresponding to the phase transformation of the sample during reheating DSC measurement under the action of the applied electric field in the temperature-varying process, i.e., $$\Delta Q_E = \frac{1}{\beta} \int_{T_1}^{T_2} \frac{dQ_E}{dt} dt,$$

wherein β is a heating rate; $T_1$ and $T_2$ respectively refer to a lower temperature limit and an upper temperature limit of an integral; and $$\frac{dQ_E}{dt}$$

is a heat flow rate measured by the DSC curve.

$\Delta Q_O$ is obtained by a DSC curve corresponding to the phase transformation of the sample during the reheating DSC measurement with no applied electric field in the temperature-varying process, i.e., $$\Delta Q_O = \frac{1}{\beta} \int_{T_1}^{T_2} \frac{dQ_O}{dt} dt,$$

wherein β is a heating rate; $T_1$ and $T_2$ respectively refer to a lower temperature limit and an upper temperature limit of an integral; and $$\frac{dQ_O}{dt}$$

is a heat flow rate measured by the DSC curve.
In one preferred embodiment, the electric field intensity E of the tested sample is calculated by means of an output voltage of the signal generator and an electrode distance in the microelectrode crucible, i.e., $$E = \frac{V}{d},$$

wherein V is the output voltage of the signal generator, and d is the electrode distance in the microelectrode crucible.

In the present embodiment, the computer connected with the differential scanning calorimeter includes a temperature control program, and the program is set to include four stages as follows: Stage I: a start temperature is set to be 4° C., and is maintained for 2 min; Stage II: cooling is performed at a rate of 3° C./min till the temperature is −60° C.; Stage III: the temperature of −60° C. is maintained for 3 min; and Stage IV: heating is performed at the rate of 3° C./min till the temperature is 10° C.

In the present embodiment, before an experiment, the microelectrode crucible needs to be subjected to a performance test to ensure that the microelectrode crucible is kept stable within a temperature range related in an experimental process, so as to prevent physical transformations or chemical reactions from interfering with the experimental process and result analysis.

The implementation modes and effects of the present invention are specifically described below through two embodiments.

Embodiment 1

Ultrapure water (hereinafter referred to as Class I water) filtered and purified by a Millipore-D24UV pure water integrated system was used as an experimental sample, and a Q2000DSC analyzer of the TA company was selected as the differential scanning calorimeter 1. Experimental steps were as follows.

1) The experiment module of the differential scanning calorimeter was opened; the reference crucible and the microelectrode crucible were placed on the corresponding sensors; the microelectrode crucible was fully fitted to the corresponding sensor; the electrode wires of the microelectrode crucible were connected to the signal generator, and the signal parameters to be output were set; 4 µl of Class I water was injected into the gap between the electrodes in the microelectrode crucible; and the microelectrode crucible lid was closed, and the experiment module of the differential scanning calorimeter was closed.

2) DSC curves of the Class I water at the temperature-varying stage and the reheating stage were measured; at the temperature-varying stage, a start temperature was set to be 4° C. and maintained for 2 min, and then was reduced to −60° C. at a rate of 3° C./min and maintained for 3 min, and at the same time, an electric field was applied to the Class I water; and at the reheating stage, the temperature was raised from −60° C. to 10° C. at the rate of 3° C./min, and no electric field is applied to the Class I water.

3) The DSC curves generated by the differential scanning calorimeter were exported from the computer for analysis, and relevant parameters were calculated.

Figure 2:
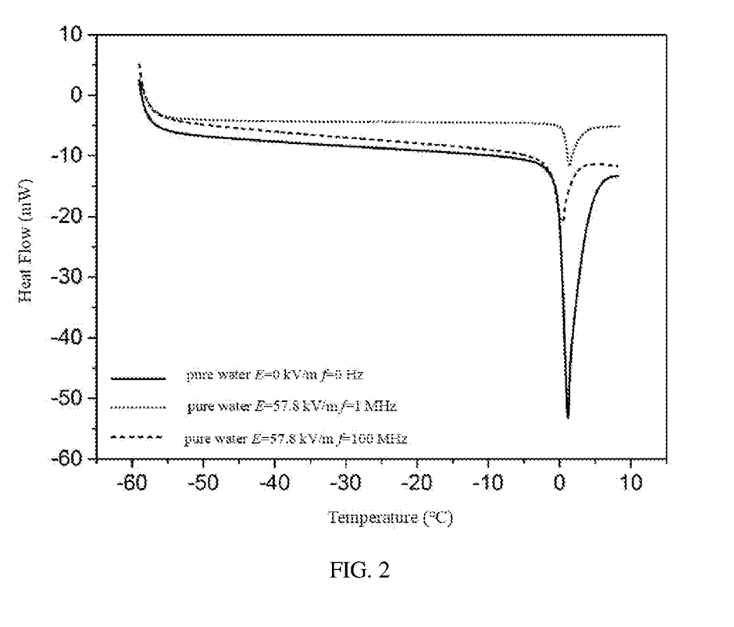
FIG. 2 is DSC curves of reheated frozen pure water under different electric field conditions according to an embodiment of the present invention.

FIG. 2 illustrates DSC curves obtained by respectively applying electric field parameters, i.e., 0 Hz, 100 kHz and 1 MHz, to the 4 µl of Class I water in a low-temperature freezing process and reheating the Class I water. It can be seen from the figure that after an electric field is applied to the Class I water in the low-temperature freezing process, a height of a melting peak of the Class I water is apparently lowered, and a peak area is obviously reduced. In a DSC heat flow curve, the area of the melting peak represents a melting enthalpy of a corresponding crystal form in a tested sample; the larger the area of the melting peak is, the greater the melting enthalpy of the corresponding crystal form is, indicating that the tested sample contains more ice crystals. Therefore, by applying the electric field to the Class I water in the low-temperature freezing process, the formation of the ice crystals can be effectively reduced, and the reducing degrees of the area of the melting peak under different applied electric field parameters are also different. $\Delta Q_E$ and $\Delta Q_O$ are obtained by integration of the melting peak, and then Class I water-ice transformation rates corresponding to different applied electric field parameters are further calculated, as shown in Table 1:

TABLE 1

Class I water-ice transformation rate η

| f (Hz) | Pure water-ice transformation rate η |
|---|---|
| 0 | 100.00% |
| 100k | 38.80% |
| 1M | 18.66% |

It can be deduced from Table 1 that an optimal applied electric field parameter of the present embodiment is 1 MHz. When the applied electric field parameter is 1 MHz, the Class I water-ice transformation rate is the lowest, which is 18.66%, so that low-temperature damage to the biological material, which is caused by the ice crystal formation, can be effectively inhibited, and the cryopreservation efficiency is improved.

Embodiment 2

The Class I water and NaCl powder with the purity of 99.99% from the Alfa Aesar company were adopted to prepare normal saline used as an experimental sample, and a Q2000DSC analyzer of the TA company was selected as the differential scanning calorimeter 1. Experimental steps were as follows.

1) The experiment module of the differential scanning calorimeter was opened; the reference crucible and the microelectrode crucible were placed on the corresponding sensors; the microelectrode crucible was fully fitted to the corresponding sensor; the electrode wires of the microelectrode crucible were connected to the signal generator, and the signal parameters to be output were set; 4 μl of normal saline was injected into the gap between the electrodes in the microelectrode crucible; and the microelectrode crucible lid was closed, and the experiment module of the differential scanning calorimeter was closed.

2) DSC curves of the normal saline at the temperature-varying stage and the reheating stage were measured; at the temperature-varying stage, a start temperature was set to be 4° C. and maintained for 2 min, and then was reduced to −60° C. at a rate of 3° C./min and maintained for 3 min, and at the same time, an electric field was applied to the normal saline; and at the reheating stage, the temperature was raised from −60° C. to 10° C. at the rate of 3° C./min, and no electric field is applied to the normal saline.

3) The DSC curves generated by the differential scanning calorimeter were exported from the computer for analysis, and relevant parameters were calculated.

Figure 3:
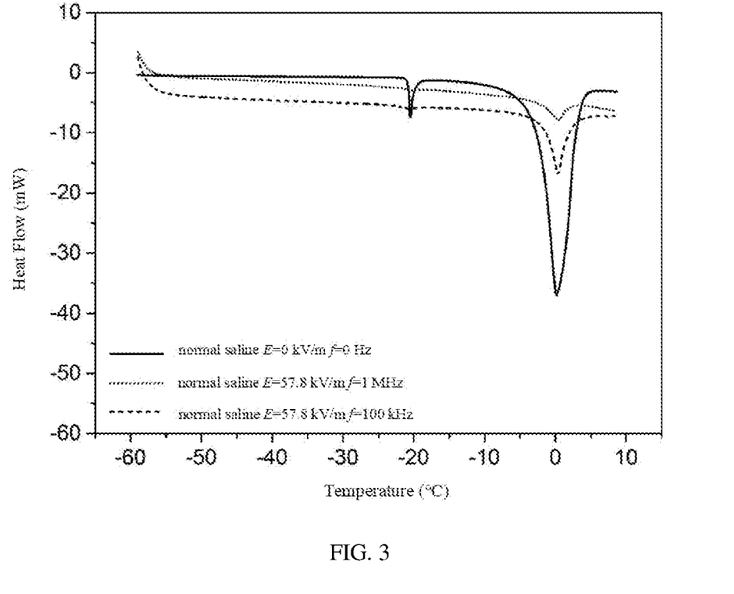
FIG. 3 is DSC curves of reheating frozen normal saline under different electric field conditions according to an embodiment of the present invention.

FIG. 3 illustrates DSC heat flow curves obtained by respectively applying electric field parameters, i.e., 0 Hz, 100 kHz and 1 MHz, to the 4 μl of normal saline in the low-temperature freezing process and reheating the normal saline. A low-temperature peak is a melting peak of eutecticevaporate mixture, i.e., salt-containing ice, formed by the addition of salt ions, and a high temperature peak is a melting peak of pure water ice. It can be seen that after the electric field is applied to the normal saline in the low-temperature freezing process, the low-temperature peak of the normal saline disappears, the height of the melting peak is apparently lowered, and the peak area is obviously reduced. Therefore, by applying the electric field to the normal saline in the low-temperature freezing process, the formation of the ice crystals can be effectively reduced, and the reducing degrees of the area of the melting peak under different applied electric field parameters are also different. $\Delta Q_E$ and $\Delta Q_O$ are obtained by integration of the melting peak, and then the pure water-ice transformation rates and salt-containing ice transformation rates corresponding to different applied electric field parameters are further calculated, as shown in Table 2.

TABLE 2 pure water ice transformation rate $\eta_1$ and salt-containing ice transformation rate $\eta_2$ in the normal saline

| f (Hz) | Pure water-ice transformation rate $\eta_1$ | Salt-containing ice transformation rate $\eta_2$ |
|---|---|---|
| 0 | 89.23% | 1.31% |
| 100k | 51.04% | 0.56% |
| 1M | 12.90% | 0.22% |

It can be deduced from Table 2 that an optimal applied electric field parameter of the present embodiment is 1 MHz. When the applied electric field parameter is 1 MHz, the pure water-ice transformation rate and the salt-containing ice transformation rate corresponding to the normal saline are the lowest, which are 12.9% and 0.22%, so that low-temperature damage to the biological material, which is caused by the ice crystal formation, can be effectively inhibited, and the cryopreservation efficiency is improved.

Therefore, in conclusion, the DSC thermal analysis method for the action of the applied electric field of the present invention can be applied in the field of analysis of the cryopreservation of the biological material.

Figure 4:
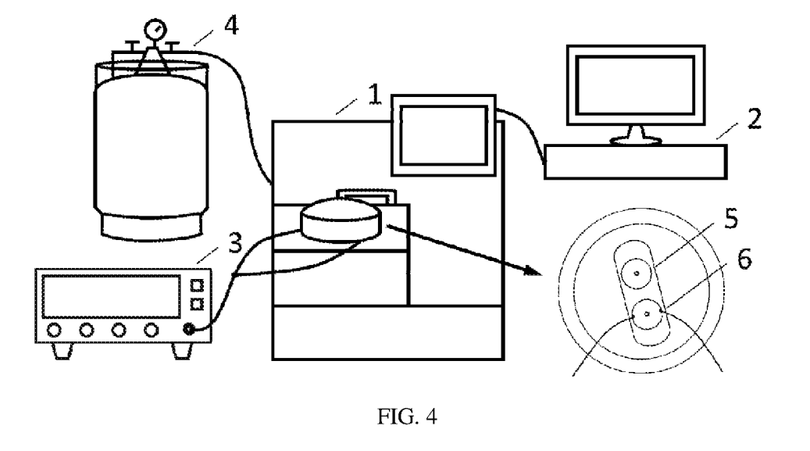
FIG. 4 is a schematic diagram of a DSC electrode system capable of applying an electric field, which is implemented according to an embodiment of the present invention.

Meanwhile, FIG. 4 illustrates a schematic diagram of a DSC electrode system capable of applying an electric field, which is implemented according to an embodiment of the present invention. DSC curves of tested samples during freezing and reheating under different electric field parameters can be detected through the system. Before an experiment, a microelectrode crucible 6 needs to be subjected to a performance test, so as to ensure that the microelectrode crucible 6 is maintained stable within a temperature range related in the experimental process. Firstly, an experiment module of a differential scanning calorimeter 1 is opened; tested samples are respectively put into the microelectrode crucible 6 and a reference crucible 5; the crucibles are completely fitted to corresponding sensors; electrode wires of the microelectrode crucible 6 are connected to a signal generator 3, and signal parameters to be output are set; a ceramic crucible lid is closed, and the experiment module is closed; secondly, a temperature control procedure matched with the differential scanning calorimeter 1 is set in a computer 2, so as to control a self-pressurization liquid nitrogen tank 4 to cool an interior of the experiment module, a temperature-varying stage and a reheating stage are included; at the temperature-varying stage, the differential scanning calorimeter 1 opens an output passageway of the signal generator 3 to apply an electric field action to the tested samples; at the reheating stage, the differential scanning calorimeter 1 closes the output passageway of the signal generator 3, the tested samples are reheated naturally with no electric field, thus generating DSC curves which are imported into the computer 2; and finally, the DSC curves obtained by measurement in the computer 2 are analyzed to calculate phase transformation rates corresponding to different applied electric field parameters.

The above describes a basic principle of the present application in conjunction with the specific embodiments. However, it should be pointed out that the benefits, advantages, effects, etc., mentioned in the present application are only examples instead of forming limitation. These benefits, advantages, effects, etc., cannot be considered as necessities for each embodiment of the present application. In addition, the specific details disclosed above are only for illustrative purposes and easy-to-understand functions, rather than constructing limitation, and the above details do not construct the limitation that the present application must be implemented by the above specific details.

The above description has been given for the purposes of illustration and description. In addition, this description is not intended to limit the embodiments of the present application to the form disclosed herein. Although multiple examples and embodiments have been discussed above, those skilled in the art will recognize some variations, modifications, changes, additions and subgroups of the examples and embodiments.

The foregoing description of the exemplary embodiments of the present invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A Differential Scanning calorimetry (DSC) thermal analysis method for the action of an applied electric field, comprising the following steps:

step 1, placing a microelectrode crucible, a reference crucible, a first tested sample, and a second tested sample into an experiment module of a differential scanning calorimeter, wherein the microelectrode crucible is used to apply an electric field to the tested sample, the reference crucible is used as a reference when no electric field is applied to the tested sample, the first tested sample is placed in the microelectrode crucible, and the second tested sample is placed in the reference crucible;

step 2, presetting a measurement temperature in a computer to control a temperature variation in the differential scanning calorimeter, wherein the presetting the measurement temperature in the computer in the step 2 comprises a temperature-varying stage and a reheating stage; at the temperature-varying stage, the differential scanning calorimeter opens an output passageway of the signal generator to apply an electric field action to the first tested sample; and at the reheating stage, the differential scanning calorimeter closes the output passageway of the signal generator, each of the first tested sample and the second tested sample are naturally reheated with no applied electric field; and measuring DSC curves of the first tested sample and the second tested sample during freezing at the temperature-varying stage under the action of the applied electric field in the microelectrode crucible and with no applied electric field in the reference crucible, and during reheating at the reheating stage without the action of the applied electric field in the microelectrode crucible and the reference crucible, wherein the computer is connected with the differential scanning calorimeter and used to transmit signals and record an experiment result; and step 3, analyzing the DSC curves to obtain an electric field intensity and a phase transformation rate of the first tested sample and the second tested sample from the temperature-varying process to the reheating process, so as to analyze the influence of different electric field parameters on the formation of ice crystals in the first tested sample, wherein the phase transformation rate η of the tested sample in the temperature-varying process is:

$$\eta = \frac{\Delta Q_E}{\Delta Q_O} \times 100\%,$$

wherein $\Delta Q_E$ refers to a quantity of heat absorbed and released by phase transformation of the first tested sample during the freezing at the temperature varying stage under the action of the applied electric field and during the reheating at the reheating stage with no electric field, and $\Delta Q_O$ refers to a quantity of heat absorbed and released by the phase transformation of the second tested sample during the temperature varying process and the reheating process with no electric field;

in the phase transformation rate η, the quantity of heat $\Delta Q_E$ absorbed or released by the phase transformation of the first tested sample during the freezing at the temperature varying stage under the action of the applied electric field and during the reheating at the reheating stage with no electric field is obtained by a DSC curve corresponding to the phase transformation of the tested sample during reheating DSC measurement under the action of the applied electric field in the freezing at the temperature-varying stage, $$\Delta Q_E = \frac{1}{\beta}\int_{T_1}^{T_2} \frac{dQ_E}{dt} dt,$$

wherein β is a heating rate; $T_1$ and $T_2$ respectively refer to integral lower temperature limit and upper temperature limit; and $$\frac{dQ_E}{dt}$$

is a heat flow rate measured by the DSC curve;

wherein in the phase transformation rate η, the quantity of heat $\Delta Q_O$ absorbed or released by the phase transformation of the second tested sample during the freezing at the temperature varying stage and the reheating at the reheating stage with no electric field is obtained by a DSC curve corresponding to the phase transformation of the sample during the reheating DSC measurement with no applied electric field in the temperature-varying process, $$\Delta Q_O = \frac{1}{\beta} \int_{T_1}^{T_2} \frac{dQ_O}{dt} dt,$$

wherein β is a heating rate; $T_1$ and $T_2$ respectively refer to integral lower temperature limit and upper temperature limit; and $$\frac{dQ_O}{dt}$$

is a heat flow rate measured by the DSC curve.

2. The method according to claim 1, wherein two electrodes are arranged in the microelectrode crucible in the step 1 to generate the electric field, and a gap is reserved between the electrodes for placing the tested sample; the tested sample is fitted to surfaces of the electrodes in the microelectrode crucible; the electrodes are connected with the signal generator through electrode wires; and the signal generator presets signal parameters to be output, and is used to provide electric signals so as to apply an electric field to the tested sample.

3. The method according to claim 2, wherein the computer in the step 2 is connected to the differential scanning calorimeter and a self-pressurization liquid nitrogen tank; and the self-pressurization liquid nitrogen tank is used to cool an interior of the experiment module of the differential scanning calorimeter.

4. The method according to claim 3, wherein the microelectrode crucible and the reference crucible in the step 1 are placed on corresponding sensors in the differential scanning calorimeter, and the sensors are used to detect heat flow changes of the tested sample in the microelectrode crucible and the reference crucible, convert the heat flow changes into electric signals, and output the electric signals to the computer; and the microelectrode crucible is fitted to the corresponding sensor.

5. The method according to claim 4, wherein the electric field intensity E of the tested sample is calculated by means of an output voltage of the signal generator and an electrode distance in the microelectrode crucible, $$E = \frac{V}{d},$$

wherein V is the output voltage of the signal generator, and d is the electrode distance in the microelectrode crucible.

6. The method of claim 5, wherein the tested sample is a saline; at the temperature-varying stage, a start temperature is set to be 4° C. and maintained for 2 min, and then is reduced to −60° C. at a rate of 3° C./min and maintained for 3 min, and at the same time, an electric field is applied to the saline; and at the reheating stage, the temperature raised from −60° C. to 10° C. at the rate of 3° C./min, and no electric field is applied to the saline.

7. The method of claim 1, further comprising: cryopreserving a biological material.

* * * * *